United States Patent [19]
Menke

[11] Patent Number: 5,959,366
[45] Date of Patent: Sep. 28, 1999

[54] ELECTRICAL CONNECTION SYSTEM FOR MOTOR-VEHICLE SUBASSEMBLY

[75] Inventor: Johannes-Theodor Menke, Velbert, Germany

[73] Assignee: Kiekert AG, Heiligenhaus, Germany

[21] Appl. No.: 09/088,930

[22] Filed: Jun. 2, 1998

[30] Foreign Application Priority Data

Jul. 26, 1997 [DE] Germany .......................... 197 32 223

[51] Int. Cl.[6] .................................................. H02G 3/02
[52] U.S. Cl. .................... 307/10.1; 307/42; 174/72 A; 439/34; 439/76.2
[58] Field of Search ................... 307/10.1, 42; 439/76.2, 439/34, 65; 361/728, 826; 701/49; 174/72 A

[56] References Cited

U.S. PATENT DOCUMENTS

| | | | |
|---|---|---|---|
| 4,360,858 | 11/1982 | Fahling | ................................. 361/679 |
| 4,799,893 | 1/1989 | Ogawa et al. | ......................... 439/76.2 |
| 4,956,748 | 9/1990 | Yamamoto et al. | ...................... 439/34 |
| 4,974,798 | 12/1990 | Harding et al. | ........................ 174/72 A |
| 5,811,732 | 9/1998 | Beam | ...................................... 361/826 |

FOREIGN PATENT DOCUMENTS

| | | |
|---|---|---|
| 0 510 843 | 10/1992 | European Pat. Off. . |
| 3641353 | 6/1989 | Germany . |
| 4435287 | 3/1996 | Germany . |

OTHER PUBLICATIONS

Handbook of Flesible Circuits by Poly Flex Circuits, 1992.

*Primary Examiner*—Albert W. Paladini
*Attorney, Agent, or Firm*—Herbert Dubno; Andrew Wilford

[57] ABSTRACT

An electrical connection system for interconnecting an electrical element of a mount with an electrical element of a subassembly has a foil secured to a face of the mount and provided with a plurality of conductive strips connected to the respective electrical element and a plurality of contacts fixed on a face of the subassembly and engageable with the strips of the foil. The two faces are pressed together as the subassembly is secured to the mount to press the two faces together and thereby engage the contacts against the strips. The contacts project from the face of the subassembly.

6 Claims, 2 Drawing Sheets

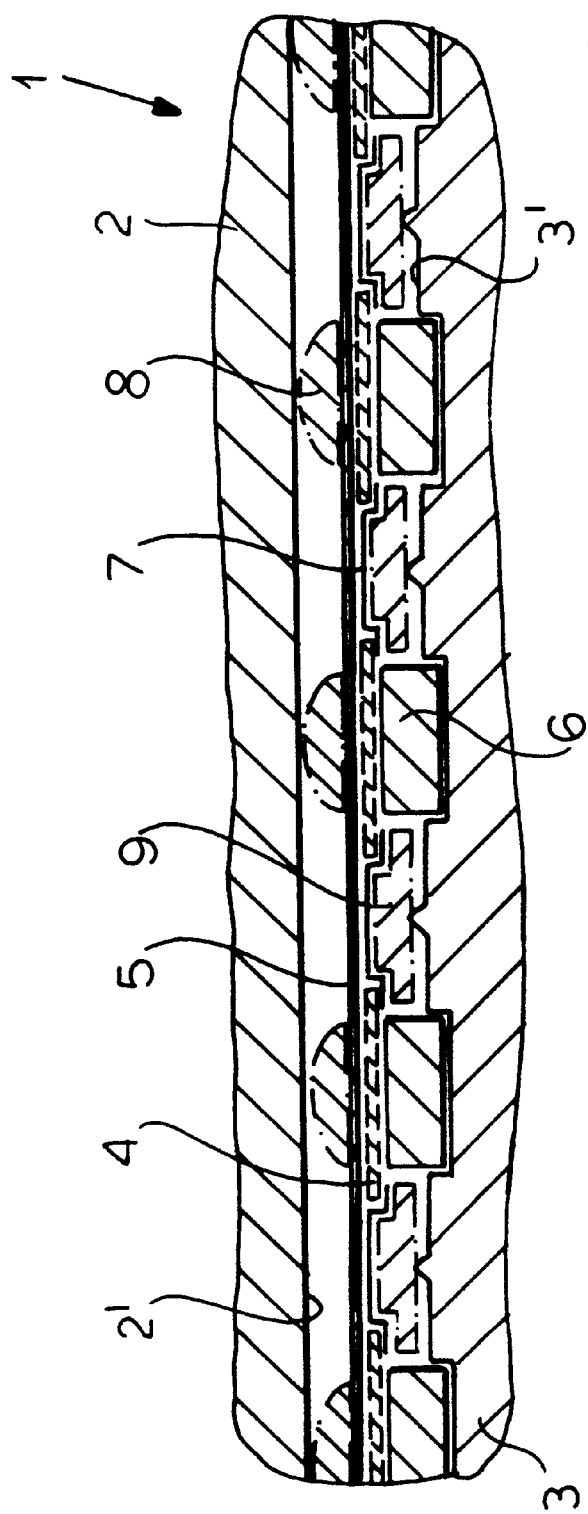
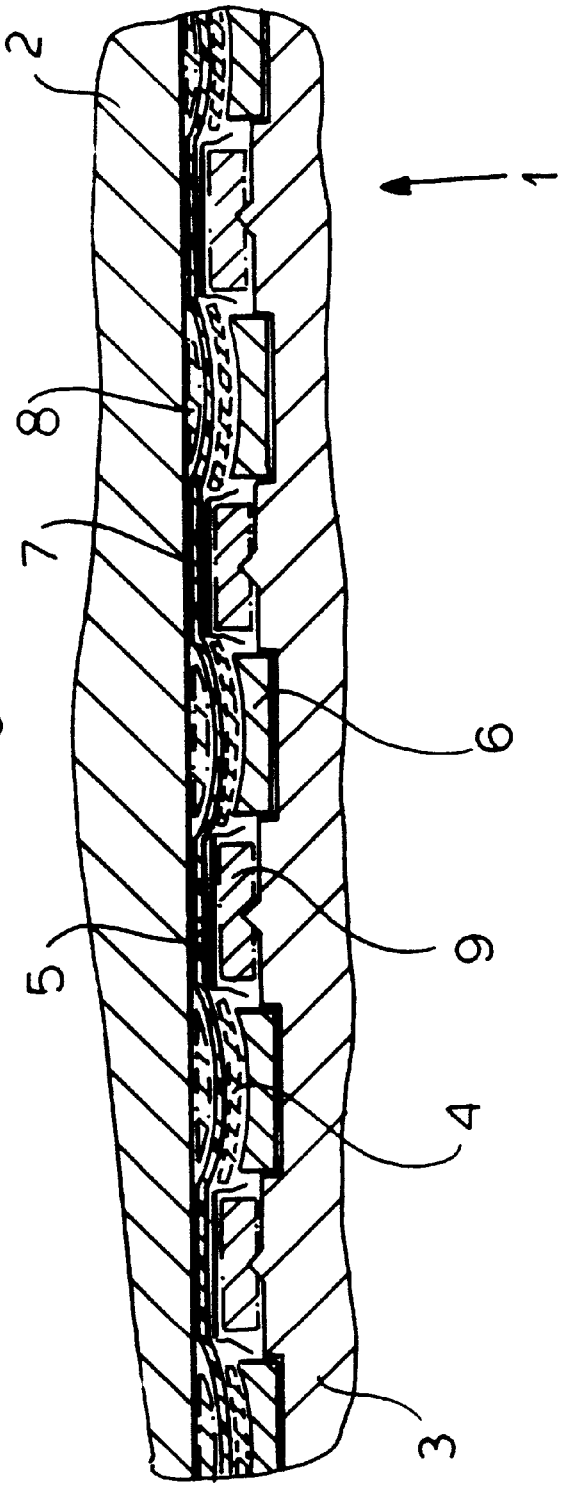

ELECTRICAL CONNECTION SYSTEM FOR MOTOR-VEHICLE SUBASSEMBLY

FIELD OF THE INVENTION

The present invention relates to an electrical connection system for a motor-vehicle subassembly. More particularly this invention concerns a system that forms the electrical connection between the electrically powered, controlled, or monitored electrical subassemblies of a motor-vehicle door, such as the latch, central-lock unit, window actuator, powered external rear-view mirror, speaker, or air bag, and an electrical supply or controller for these subassemblies.

BACKGROUND OF THE INVENTION

Today's motor vehicles are increasingly provided with subassemblies that are electrically powered and/or monitored. Thus a typical door can hold a latch that itself includes electrically powered actuators and various position switches, a window actuator as well as position-detecting switches for the window, and one or more speakers. The various position switches are connected to the on-board computer and the window and latch actuators are similarly connected to the appropriate controllers while the speakers are connected to the sound system.

The standard method of making these connections is by providing one or more plugs or sockets on the subassembly and complementary plugs or sockets on the vehicle, with one part of each pair of mating parts carried at the end of a multiconductor cable so that it can be fitted with its mate before the subassembly is actually installed on the vehicle, typically by screwing or bolting. This type of hookup entails an extra step in the assembly of the vehicle and the hardware is complex and, therefore, adds unnecessarily to the vehicle cost.

OBJECTS OF THE INVENTION

It is therefore an object of the present invention to provide an improved electrical connection system for a motor-vehicle subassembly.

Another object is the provision of such an improved electrical connection system for a motor-vehicle subassembly which overcomes the above-given disadvantages, that is which is simple to connect up and inexpensive to manufacture.

SUMMARY OF THE INVENTION

An electrical connection system for interconnecting an electrical element of a motor-vehicle door mount with electrical elements of a subassembly mounted in the motor-vehicle door has according to the invention a foil secured to a face of the mount and provided with a plurality of conductive strips connected to the respective electrical element and a plurality of contacts fixed on a face of the subassembly and engageable with the strips of the foil. The two faces are pressed together as the subassembly is secured to the mount to press the two faces together and thereby engage the contacts against the strips. The contacts project from the face of the subassembly.

Thus with this system it is only necessary to, for example, bolt the subassembly to the mount to form the necessary electrical connections between these two parts. No separate plug or socket dangling on a wire is needed, so that construction costs are reduced, and the connection is foolproof.

According to the invention an insulating layer overlies the foil and strips and exposes selected areas of the strips aligned with the contacts. In addition respective compressible bumper bodies are provided between the foil and the face of the mount and are each aligned with a respective contact so that the bumper bodies are compressed when the subassembly is bolted to the mount to press the respective conductive strip against the respective contact. To prevent leakage of water between the mount and the subassembly, for instance when the subassembly is a powered exterior rear-view mirror, a layer of compressible material overlies the foil and conductive strips and is formed with holes exposing selected areas of the strips aligned with the contacts.

To ensure perfect alignment of the contacts with the respective exposed spots of the conductive strips one of the faces is formed with a recess open toward the other face and the other face is formed with a projection extending through the foil into the recess.

BRIEF DESCRIPTION OF THE DRAWING

The above and other objects, features, and advantages will become more readily apparent from the following description, reference being made to the accompanying drawing in which:

FIGS. 1 and 2 are large-scale sections through the connection assembly according to the invention before and after final securing of the subassembly to the motor vehicle.

SPECIFIC DESCRIPTION

Figure 3:
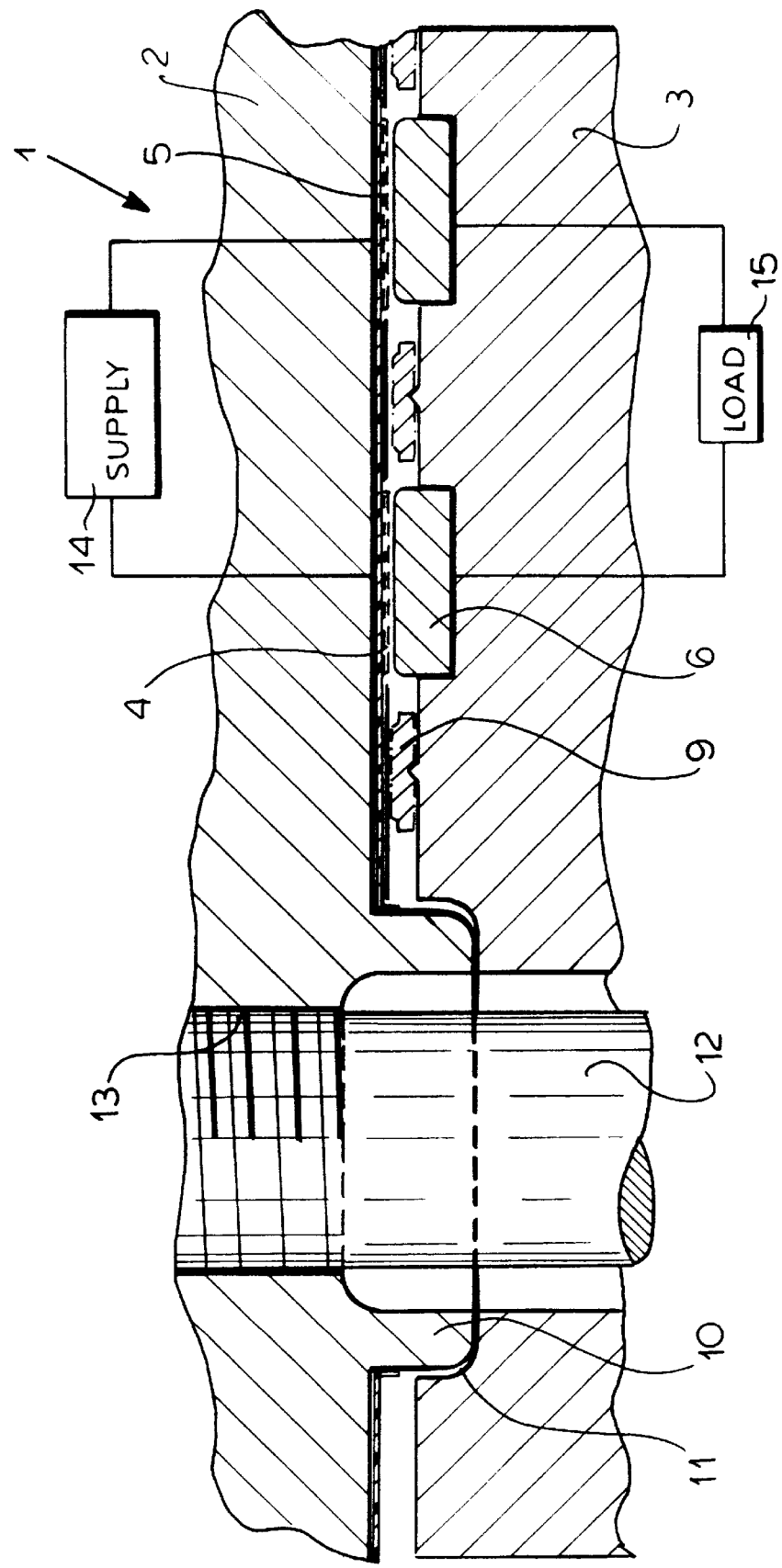
FIG. 3 is a large-scale view of a detail of the connection assembly.

As seen in FIGS. 1 through 3 an electrical connection system 1 serves for interconnecting, for example, an electrical supply 14 on a mount 2 of or forming part of a motor-vehicle body to a load 15 on a part or subassembly 3 that is normally secured to the mount 2 by means of a bolt 12. The mount 2 is provided on its outer face 2' with a flexible plastic foil 5 carrying conductive strips 4 that are connected to the supply 14 or to a controller or other electrical device. Overlying this foil 5 with its conductive strips 4 is a thin synthetic-resin layer 7 of insulating material formed with throughgoing holes at selected locations on the strips 4 corresponding to the locations of contacts 6 of the subassembly 3. Overlying this insulating layer 7 is in turn a thicker seal layer 9 of compressible plastic foam, e.g. foamed polyurethane, material formed with a similar array of holes aligned with the holes in the layer 7 and the contacts 6. In addition underneath each of the holes in the layers 7 and 8 is a compressible body 8, held in place between a back face of the foil 5 and the face 2' of the mount 2.

The foil 5 with its conductive paths or strips 4 can be formed conventionally. A standard foam extruder can form the bumper bodies 8 and the seal layer 9. In addition as shown in FIG. 3 the mount 2 is formed with a circularly annular ridge or protrusion 10 that fits loosely in a complementary recess 11 in the subassembly 3. These formations 10 and 11 serve to center the two parts 2 and 3 relative to each other. The slight play between the formations 10 and 11 allows some room for adjustment without, however, allowing them to move enough to bring any of the contacts 6 of the subassembly 3 out of contact with the respective spots on the conductive strips 4.

Thus according to the invention when the two parts 2 and 3 are secured together by the bolt 12 extending perpendicular to the plane between them, the contacts 6 will engage through the holes in the seal sheet 9 and insulating layer 7 and press against the conductive strips 4, compressing the bumper bodies 8. The result is an extremely good electrical connection between the contacts 6 and the strips 4 that is automatically formed as the subassembly 3 is secured to the mount 2.

I claim:

1. An electrical connection system for interconnecting an electrical element of a motor-vehicle door mount with electrical elements of a subassembly mounted in a motor-vehicle door, the connection system comprising:

a foil secured to a face of the motor-vehicle door mount and provided with a plurality of conductive strips connected to the respective electrical elements;

a plurality of contacts fixed on a face of the subassembly and engageable with the strips of the foil; and securing means for pressing the two faces together and thereby engaging the contacts against the strips.

2. The electrical connection system defined in claim 1 wherein the contacts project from the face of the subassembly.

3. The electrical connection system defined in claim 1, further comprising an insulating layer overlying the foil and strips and exposing selected areas of the strips aligned with the contacts.

4. The electrical connection system defined in claim 1, further comprising respective compressible bumper bodies between the foil and the face of the mount and each aligned with a respective contact, whereby the bumper bodies are compressed when the subassembly is bolted to the mount to press the respective conductive strip against the respective contact.

5. The electrical connection system defined in claim 1, further comprising a layer of compressible material overlying the foil and conductive strips and formed with holes exposing selected areas of the strips aligned with the contacts.

6. The electrical connection system defined in claim 1, wherein one of the faces is formed with a recess open toward the other face and the other face is formed with a projection extending through the foil into the recess.

\* \* \* \* \*